(12) United States Patent
Gibellini

(10) Patent No.: US 7,525,297 B2
(45) Date of Patent: Apr. 28, 2009

(54) CURRENT TRANSFORMER WITH IMPEDANCE COMPENSATION AND ASSOCIATED METHODS

(75) Inventor: Umberto Gibellini, Coral Gables, FL (US)

(73) Assignee: FALCO Ltd., Hong Kong (HK)

( * ) Notice: Subject to any disclaimer, the term of this patent is extended or adjusted under 35 U.S.C. 154(b) by 0 days.

(21) Appl. No.: 11/291,750

(22) Filed: Dec. 1, 2005

(65) Prior Publication Data

US 2007/0126411 A1    Jun. 7, 2007

(51) Int. Cl.
*H01F 38/28* (2006.01)
(52) U.S. Cl. .................. 323/357; 323/356; 324/127
(58) Field of Classification Search .......... 323/357, 323/356, 358; 324/127, 128; 336/173
See application file for complete search history.

(56) References Cited

U.S. PATENT DOCUMENTS

| | | | |
|---|---|---|---|
| 3,534,247 A | | 10/1970 | Miljanic |
| 3,881,149 A | * | 4/1975 | Kiko ........................ 323/356 |
| 4,198,595 A | * | 4/1980 | Milkovic ................... 323/357 |
| 4,463,307 A | * | 7/1984 | Kiko et al. ................ 323/356 |
| 4,467,269 A | * | 8/1984 | Barzen ..................... 323/356 |
| 4,554,504 A | * | 11/1985 | Dillon ...................... 323/356 |
| 4,628,251 A | | 12/1986 | Halder |
| 4,792,701 A | * | 12/1988 | Olon et al. .................. 307/11 |
| 4,835,463 A | * | 5/1989 | Baran et al. ............. 324/123 R |
| 4,939,451 A | * | 7/1990 | Baran et al. ................ 324/127 |
| 5,276,394 A | | 1/1994 | Mayfield |
| 5,369,355 A | * | 11/1994 | Roe ......................... 323/356 |
| 6,522,517 B1 | * | 2/2003 | Edel ........................ 361/143 |
| 6,674,278 B1 | * | 1/2004 | Uesugi ..................... 324/127 |

* cited by examiner

*Primary Examiner*—Akm E Ullah
*Assistant Examiner*—Harry Behm
(74) *Attorney, Agent, or Firm*—Lott & Friedland, PA

(57) ABSTRACT

An impedance-compensated current transformer comprising a primary winding, a power source electrically coupled through the primary winding; a secondary winding magnetically coupled to the first primary winding, the secondary winding having a secondary winding impedance and a secondary winding resistance; and an impedance-compensation circuit electrically coupled across the secondary winding; wherein the impedance-compensation circuit actively reflects to the secondary winding a virtual impedance which is equal in magnitude and opposite in polarity to the secondary winding impedance.

9 Claims, 9 Drawing Sheets

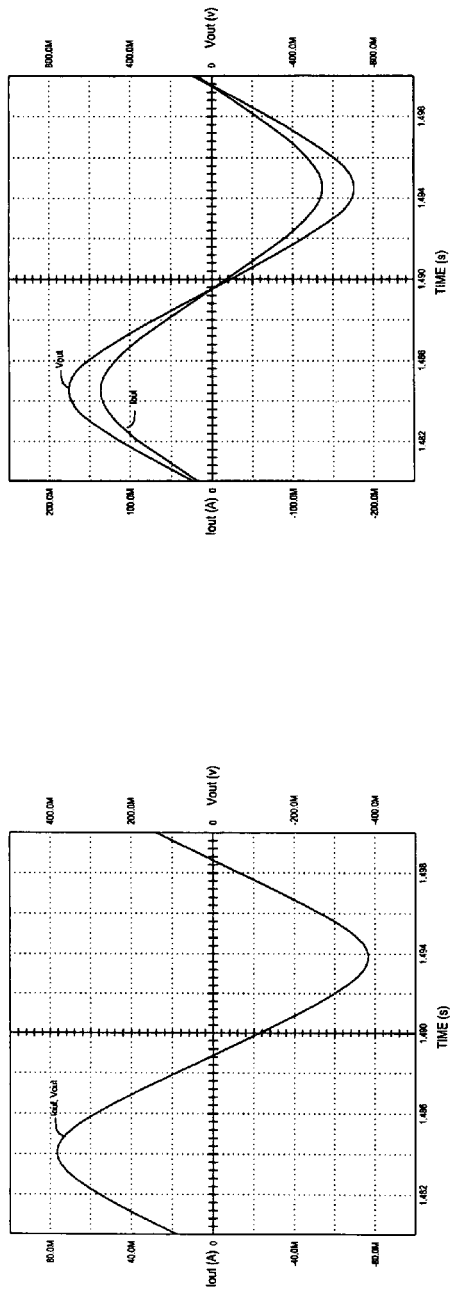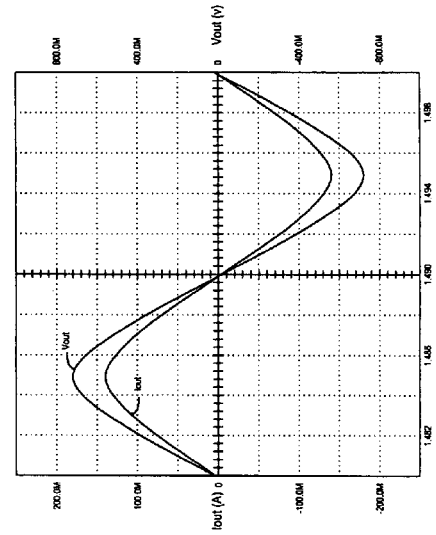
FIG. 2 (Prior Art)
FIG. 3 (Prior Art)
FIG. 4 (Prior Art)

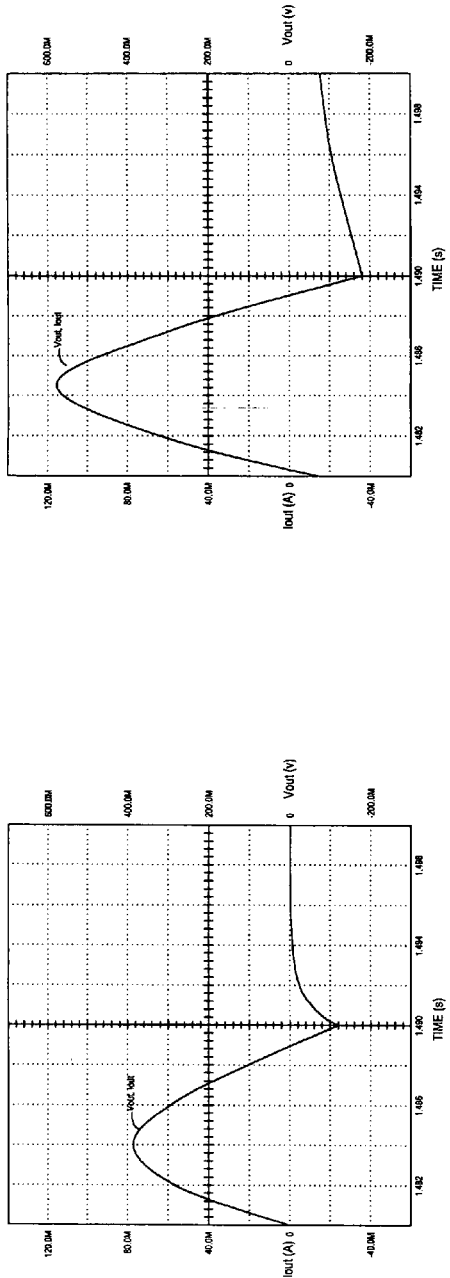
FIG. 10
(Prior Art)
FIG. 11
(Prior Art)
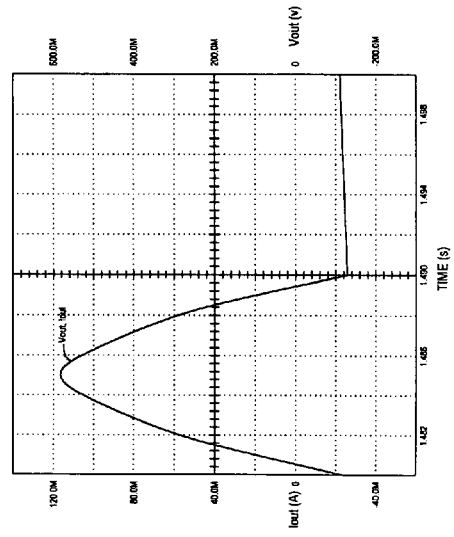
FIG. 12
(Prior Art)

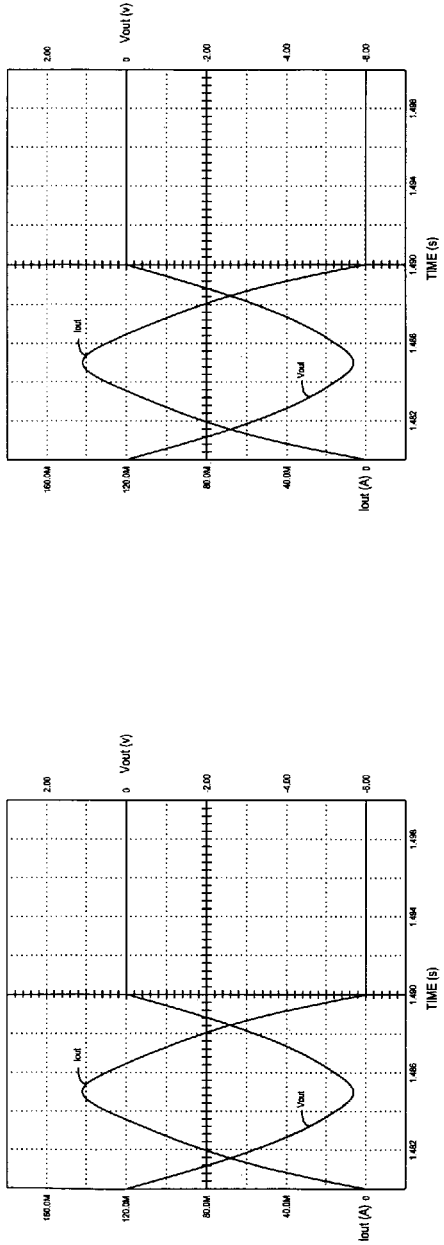
FIG. 15
FIG. 14
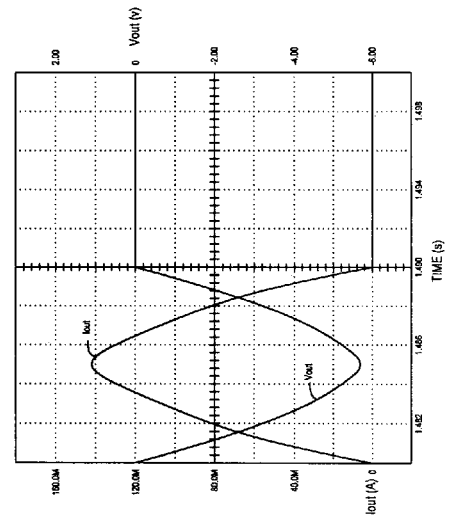
FIG. 16

CURRENT TRANSFORMER WITH IMPEDANCE COMPENSATION AND ASSOCIATED METHODS

TECHNICAL FIELD

This invention relates generally to the field of current transformers and specifically to a high-precision current transformer, such as one used for electrical measurements, incorporating an impedance compensation circuit which permits operation at greatly reduced magnetizing inductance levels without significant reduction of precision and with greatly increased tolerance to DC components in the input current.

BACKGROUND OF THE INVENTION

Current transformers are electrical devices which, provided with an input (or primary) alternating current, generate an output (or secondary) alternating current which is a multiple or a fraction of the input current. Current transformers are traditionally used in electrical measurement and calibration applications where high precision is often a requirement. A current transformer used for electrical measurement generally has an input current in the range of the 100's of amperes (Amp) and an output in the range of 100's of miliamperes (mA.) A current transformer used for electrical measurement applications will have a known input/output current ratio which allows for the determination of the level of the input current from a relatively low, but proportional, output current.

For obvious reasons, it is desirable that the level of the input/output current ratio be as precise as possible throughout the range of expected input current levels. In order to achieve the level of precision required for high-end applications, however, current transformers of conventional designs have suffered from several shortcomings.

Specifically, a high-precision current transformer of traditional design must have very small magnetizing or excitation current ($I_{mag}$) levels with an ideal transformer having an $I_{mag}$ of zero. Since $I_{mag}$ is directly proportional to the magnetizing voltage ($V_{mag}$), $V_{mag}$ also must be relatively small. Both $I_{mag}$ and $V_{mag}$ are considered parasitic losses and must be minimized in order to improve the accuracy of a high-precision current transformer. This, in turn, requires that the magnetizing inductance ($L_{mag}$) of the transformer be very large and conversely that loses in the transformer's core be relatively small.

In order to achieve the required large $L_{mag}$ values, a common approach is to utilize a secondary winding that has a large number of turns of very fine wire material. This approach, however is limited in that as the number of turns increases, and the cross section of the wire decreases, the resistance of the secondary winding increases and creates an unwanted proportional increase in $V_{mag}$ and $I_{mag}$. This can be counteracted by utilizing heavier gauge wire and core materials having high electrical permeability and low loss factors. However, these measures tend to significantly increase the size and cost of the current transformer.

A second shortcoming of traditional current transformer designs is the fact that they are very intolerant to direct current (DC) components present in the input or primary current ($I_{pri}$). Because $L_{mag}$ values must be maintained at very high levels to improve accuracy, and because the resistance of the secondary winding must be kept relatively low, the L/R time constant for this circuit tends to be so large that the DC component of $V_{mag}$ is integrated to produce a DC component of $I_{mag}$ that is also very large and degrades the precision of the current sensed through the burden resistor.

Of course, this effect could be counteracted by reducing $L_{mag}$ or increasing the secondary winding's resistance. However, this would, in turn, have a negative impact in that it would increase $I_{mag}$ from the AC component and ultimately deteriorate overall accuracy.

The way this shortcoming is normally addressed in traditional current transformer designs is simply by utilizing core materials which have a high flux tolerance and relatively low loss factors. The primary DC component will produce a corresponding DC component in the secondary. For a half wave rectified sine of primary current the DC bias in the secondary current can cause an additional RMS error up to 23%, As the portion of normal AC current increases the corresponding error decreases. As before, however, these measures would have a negative impact on the size and cost of the resulting transformer.

Previous attempts have been made to improve the performance of current transformers through the use of impedance compensation. Examples of such attempts are described in U.S. Pat. No. 3,534,247 to Miljanic (the '247 patent); U.S. Pat. No. 4,628,251 to Halder (the '251 patent); and U.S. Pat. No. 5,276,394 to Mayfield (the '394 patent).

However, none of these references describes a high-precision current transformer incorporating an impedance compensation circuit like the one described in detail below which continuously exposes the secondary winding of the transformer to virtual impedance of equal but negative magnitude to its own, thus virtually reducing the values of $I_{mag}$ and $V_{mag}$ to zero.

Furthermore, none of the above references describes a high-precision current transformer incorporating an impedance compensation circuit that exhibits high tolerance to elevated direct current components in the input current.

Therefore, there is a need in the prior art to provide a high-precision current transformer incorporating an impedance compensation circuit which permits operation with magnetizing current and voltage levels at or near zero.

There is a further need in the art to provide a high-precision current transformer that does not require high levels of magnetizing inductance to maintain its accuracy.

There is a further need in the art to provide a high-precision current transformer that does not require core materials which have high electrical permeability or low loss factors.

There is a further need in the art to provide a high-precision current transformer that does not require the use of a relatively large secondary winding composed of lower resistance, heavier gauge, wire.

There is a further need in the art to provide a high-precision current transformer that is highly tolerant of elevated DC components in the input current without excessive degraded accuracy.

There is a further need in the art to provide a high-precision current transformer that increases the tolerance for elevated DC components in the input current without utilizing core materials which have a high flux tolerance or relatively low loss factors.

SUMMARY OF THE INVENTION

The subject invention resolves the above-described needs and problems by providing a current transformer incorporating an impedance compensation circuit which presents to the secondary winding of the transformer a virtual impedance of equal but negative magnitude, thus virtually reducing the values of $I_{mag}$ and $V_{mag}$ to zero.

The disclosed impedance-compensated current transformer comprises a primary winding, a power source electrically coupled across the primary winding; a secondary winding magnetically coupled to the first primary winding, the secondary winding having a secondary winding impedance and a secondary winding resistance; and an impedance-compensation circuit electrically coupled across the secondary winding; wherein the impedance-compensation circuit actively reflects to the secondary winding a virtual impedance which is equal in magnitude and opposite in polarity to the secondary winding impedance.

In the current transformer of the present invention, the burden resistor is replaced by an impedance compensation circuit that actively reflects to the secondary winding a "virtual" impedance which, at all times, automatically matches that of the secondary winding but is of the opposite polarity. Thus, the net effect is that the virtual circuit impedance and actual impedance of the secondary winding "cancel out" and the parasitic effects of $V_{mag}$ and $I_{mag}$ are effectively reduced to negligible values. This effect renders the current transformer essentially "lossless" throughout its entire operating range.

The impedance compensation circuit of the present invention consists of an operational amplifier whose output is optionally coupled through a current boosting circuit. The operational amplifier circuit actively modifies its output voltage so that the impedance presented by the compensation circuit is maintained at a level that is equal but opposite to that of the secondary winding. The secondary winding is connected in series with the impedance compensation circuit so that all AC excitation effects are effectively cancelled out.

Accordingly, it is an object of the present invention to provide a high-precision current transformer incorporating an impedance compensation circuit which permits operation with magnetizing current and voltage levels at or near zero.

It is a further object of the present invention to provide a high-precision current transformer that does not require high levels of magnetizing inductance to maintain its accuracy.

It is a further object of the present invention to provide a high-precision current transformer that does not require core materials which have high electrical permeability or low loss factors.

It is a further object of the present invention to provide a high-precision current transformer that does not require the use of a relatively large secondary winding composed of lower resistance, heavier gauge, wire.

It is a further object of the present invention to provide a high-precision current transformer that is highly tolerant of elevated DC components in the input current It is a further object of the present invention to provide a high-precision current transformer that increases the tolerance for elevated DC components in the input current without utilizing core materials which have a high flux tolerance or relatively low loss factors.

These and other objects, features, and advantages of the present invention may be more clearly understood and appreciated from a review of ensuing detailed description of the preferred and alternate embodiments and by reference to the accompanying drawings and claims.

BRIEF DESCRIPTION OF THE DRAWINGS

FIG. 2 illustrates the output voltage ($V_{out}$) and current ($I_{out}$) present at the burden resistor R3 of the circuit in FIG. 1 with a secondary winding magnetic inductance ($L_{mag}$) value of 50 mH.

FIG. 3 illustrates the output voltage ($V_{out}$) and current ($I_{out}$) present at the burden resistor R3 of the circuit in FIG. 1 with a secondary winding magnetic inductance ($L_{mag}$) value of 500 mH.

FIG. 4 illustrates the output voltage ($V_{out}$) and current ($I_{out}$) present at the burden resistor R3 of the circuit in FIG. 1 with a secondary winding magnetic inductance ($L_{mag}$) value of 5,000 mH.

FIG. 10 illustrates the output voltage ($V_{out}$) and current ($I_{out}$) present at the burden resistor R3 of the circuit in FIG. 9 with a secondary winding magnetic inductance ($L_{mag}$) value of 50 mH.

FIG. 11 illustrates the output voltage ($V_{out}$) and current ($I_{out}$) present at the burden resistor R3 of the circuit in FIG. 9 with a secondary winding magnetic inductance ($L_{mag}$) value of 500 mH.

FIG. 12 illustrates the output voltage ($V_{out}$) and current ($I_{out}$) present at the burden resistor R3 of the circuit in FIG. 9 with a secondary winding magnetic inductance ($L_{mag}$) value of 5,000 mH.

FIG. 14 illustrates the output voltage ($V_{out}$) and current ($I_{out}$) present at the burden resistor R4 of the circuit in FIG. 13 with a secondary winding magnetic inductance ($L_{mag}$) value of 50 mH.

FIG. 15 illustrates the output voltage ($V_{out}$) and current ($I_{out}$) present at the burden resistor R4 of the circuit in FIG. 13 with a secondary winding magnetic inductance ($L_{mag}$) value of 500 mH.

FIG. 16 illustrates the output voltage ($V_{out}$) and current ($I_{out}$) present at the burden resistor R4 of the circuit in FIG. 13 with a secondary winding magnetic inductance ($L_{mag}$) value of 5,000 mH.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Figure 5:
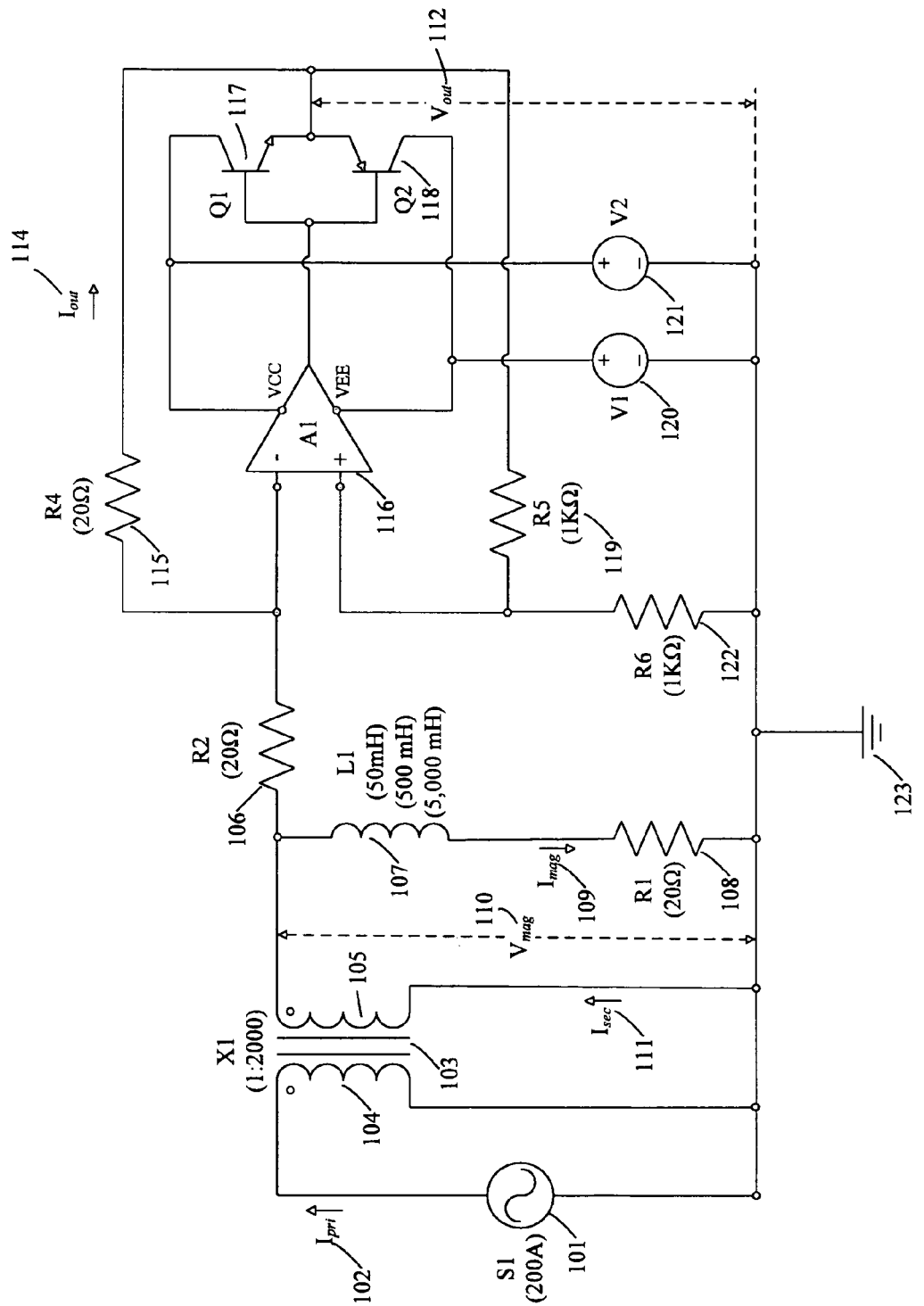
FIG. 5 illustrates a schematic representation of a current transformer according to an embodiment of the present invention driven by an AC source having a power profile of 200 A (rms), 282.8 A (peak), 50 Hz sinewave.

For purposes of illustrating the benefits and advantages of the present invention in relation to current transformers not utilizing the disclosed novel impedance compensating circuit, provided is a schematical representation of a typical current transformer of the prior art together with graphs representing its calculated output voltages and currents for scenarios involving secondary windings having increasing levels of magnetic inductance ($L_{mag}$). This set of illustrations (FIGS. 1-4) demonstrates that the precision of the transformer dramatically increases as $L_{mag}$ increases and core excitation levels, represented by $I_{mag}$ and $V_{mag}$ decrease. Provided next in FIG. 5 is a schematical representation of a current transformer with the same inputs and general characteristics as the transformer shown in FIG. 1 except that it incorporates the disclosed novel impedance compensating circuit. As is shown in the graphs in FIGS. 6-8, the current transformer of the present invention has dramatically increased precision even at relatively low levels of $L_{mag}$ and core excitation levels ($I_{mag}$, $V_{mag}$) are essentially negligible for all the illustrations.

A similar comparative demonstration is shown in FIGS. 9-16 except that the power source for both current transformers is replaced by a rectified halfwave AC source. These figures illustrate the increased error displayed by current transformers of the prior art when exposed to DC elements in the primary current as well as the increased tolerance shown for said elements by the novel current transformer of the present invention. The reduction in error is dependent on the value of R1, which is a lumped, linearized representation of core excitation losses.

Figure 1:
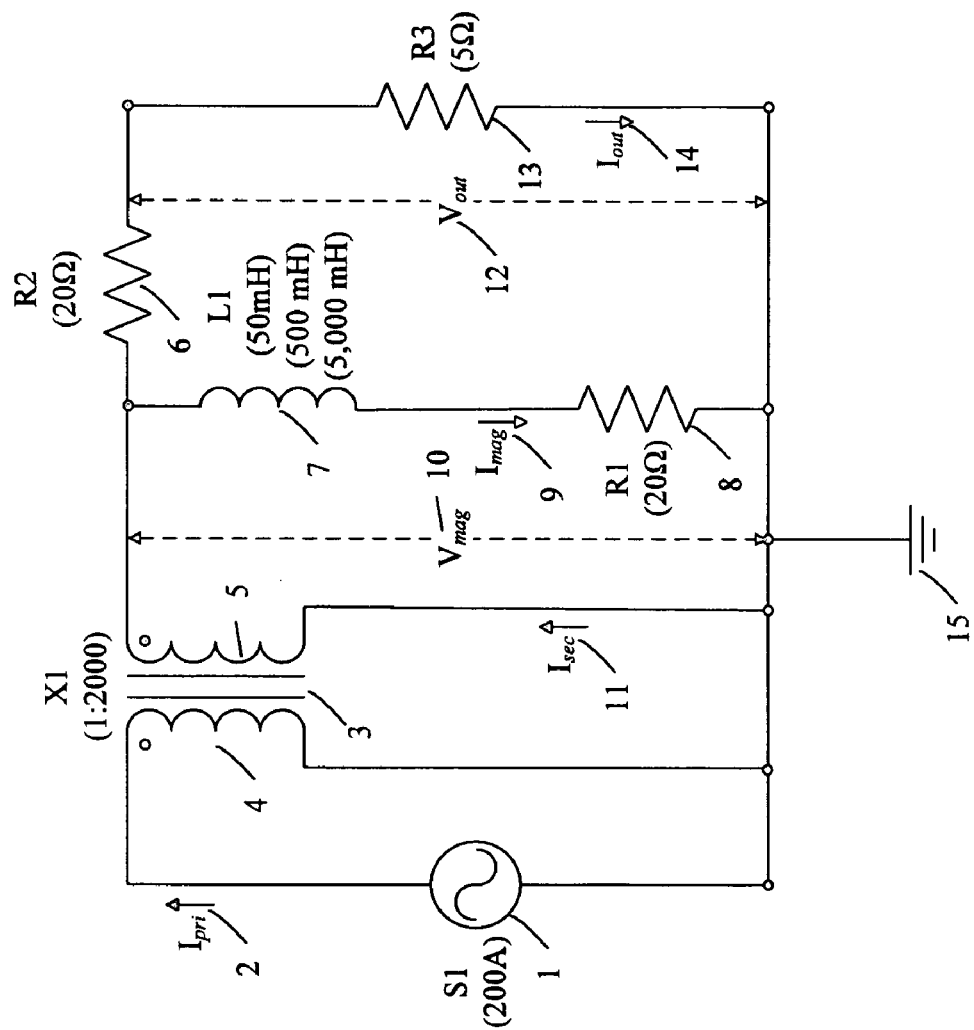
FIG. 1 illustrates a schematic representation of a typical current transformer according to the prior art driven by an AC source having a power profile of 200 A (rms), 282.8 A (peak), 50 Hz sinewave.

Referring initially to FIG. 1, illustrated is a schematic representation of a typical current transformer according to the prior art. The current transformer is driven by an AC power source (1) generating a primary current $I_{pri}$ (2). The core transformer X1 (3) has a primary winding (4) and a secondary winding (5).

On the current-sensing side, the parasitic elements of the secondary winding (5) are comprised of winding resistance and magnetic inductance ($L_{mag}$), represented for convenience by resistor R2 (6) and by inductor L1 (7) connected in parallel with the secondary winding (5). Finally, the burden load is represented by resistor R3 (13) and the common ground is shown as (15).

Also illustrated in FIG. 1 are the various measurements of interest for purposes of determining the accuracy of the current transformer: $V_{mag}$ (10) is the magnetizing voltage drop across the secondary winding; $I_{mag}$ (9) is the magnetizing current flowing through the L1 inductor (7) leg of the parallel circuit; $V_{out}$ (10) is the output voltage drop measured across the burden resistor R3(13), and $I_{out}$ (9) is the output current flowing through burden resistor R3(13).

For purposes of illustration, the current transformer shown in FIG. 1 has the operating parameters shown in Table 1.

TABLE 1

| Parameter | Value |
|---|---|
| Primary Current ($I_{pri}$) | 200 A(rms); 282.8 A(peak); 50 Hz Sinewave |
| Transformer Turn Ratio (Secondary:Primary) | 2000:1 |
| Secondary Winding Resistance (R2) | 20 Ω. |
| Secondary Winding Magnetic Inductance ($L_{mag}$) | Variable - 50, 500, 5,000 or 50,000 mH. |

Using fundamental calculations well known to those reasonably skilled in the relevant art, it is easily shown that a theoretical current transformer having these parameters and ignoring parasitic effects for the secondary winding should have an output current ($I_{out}$) of 100 mA (rms) and an output voltage ($V_{out}$) of 500 mV (rms). These values can be used as baselines to illustrate the accuracy of a current transformer of this design under operating conditions at various levels of $L_{mag}$.

Referring now to FIGS. 2-4, illustrated are graphs of the output of the transformer of FIG. 1 at $L_{mag}$ levels of 50, 500, and 5,000 mH respectively. Table 2 summarizes the resulting values of $I_{out}$ and $V_{out}$ and the error (expressed as a percentage) for each.

TABLE 2

| | Expected Values | | Actual Values | | |
|---|---|---|---|---|---|
| $L_{mag}$ mH | $I_{out}$ mA(rms) | $V_{out}$ mV(rms) | $I_{out}$ mA(rms) | $V_{out}$ mV(rms) | % Error |
| 50 (FIG. 2) | 100 | 500 | 53.3 | 267 | 46.7% |
| 500 (FIG. 3) | 100 | 500 | 96.9 | 484 | 3.1% |
| 5,000 (FIG. 4) | 100 | 500 | 100.0 | 500 | 0% |

As Table 2 illustrates, as $L_{mag}$ is increased, the values of $I_{out}$ and $V_{out}$ approach the expected values. Near-zero error is not achieved until a relatively high value of 5,000 mH is used for $L_{mag}$.

Referring next to FIG. 5, illustrated is a schematic representation of a novel current transformer according to the present invention. The current transformer shown in FIG. 5 is identical in all respects to that of the current transformer of FIG. 1 with the exception that the burden resistor R3 (13) has been replaced by the disclosed novel impedance compensating circuit.

The current transformer of FIG. 5 is driven by an AC power source (101) generating a primary current $I_{pri}$ (102). The core transformer X1 (103) has a primary winding (104) and a secondary winding (105).

On the current-sensing side, the parasitic elements of the secondary winding (105) are comprised of winding resistance and magnetic inductance ($L_{mag}$), represented for convenience by resistor R2 (106) and by inductor L1 (107) connected in parallel with the secondary winding (105). Also included is resistor R1 (108) which represents core losses and is connected in series with inductor L1 (107) and in parallel with the secondary winding (105).

The impedance compensation circuit consists of an operational amplifier A1 (116) whose output is optionally boosted by current boosting transistors Q1 (117) and Q2 (118). Operational amplifier A1 (116) is powered by voltage sources V1

(120) (negative supply) and V2 (121) (positive supply). As illustrated, Q1 (117) is an NPN transistor and Q2 (118) is a PNP transistor. The negative (i.e., inverting) input of operational amplifier A1 (116) is connected in series with the secondary winding (105) and in parallel with resistor R4 (115) which here has a resistance equal to that of the winding resistance R2 (106). The positive (i.e., non-inverting) input of operational amplifier A1 (116) is connected to resistor R6 (122) which in turn is connected to common ground (123). Finally, the boosted output of the Q1-Q2 (117, 118) network is connected in series with resistor R5 (119) which in turn also connects to common ground (123) resistor R6 (122). The resistance of R5 (119) and R6 (122) in this case are the same and typically are a higher value (e.g. 1000Ω or greater) relative to the value of R4 (115) and R2 (106).

It will be understood by those reasonably skilled in the art that operational amplifier A1 (116) and transistors Q1 (117) and Q2 (118) are selected from among the many commercially available semiconductors that are capable of handling the maximum expected $V_{out}$ and $I_{out}$ loads.

The disclosed impedance compensation circuit actively generates a virtual impedance that is equal in magnitude but opposite in polarity to that of the secondary winding (105). The transformed secondary current flows first through resistor R2 (106) representing impedance of the secondary winding (105) and then through the impedance compensation circuit having said virtual impedance. With the resulting combined impedance equaling or near zero, $I_{mag}$, $V_{mag}$ and core loses also approach zero thus eliminating all sources of error independently of any change in $L_{mag}$. This allows the current transformer to operate at very elevated levels of accuracy with a transformer core having relatively low values of $L_{mag}$. The disclosed circuit does not require a core with low loss characteristics (i.e., of large size), and, since $I_{mag}$, $V_{mag}$ approach zero, a high flux tolerant core is also not needed.

Using basic electrical theory, it is shown that under load, operational amplifier A1 (116), along with current boosting network Q1-Q2 (117, 118) lowers its output voltage so that all current flowing through R2 (106) is directed through R4 (115). The virtual impedance ($Z_{virt}$) reflected by the impedance compensation circuit is calculated using the equation:

$$Z_{virt} = \frac{R4}{1 - \frac{R6 + R5}{R6}}$$

When R5 (119) is equal to R6 (122), $Z_{virt}$ will equal (−)R4 (115). Since the resistance of R4 is here set to a value equal to the impedance of the secondary winding (105) as represented by R2 (106), the net effect is that R2 and $Z_{virt}$ cancel out and reduce the secondary winding's (105) effective impedance to zero. Concomitantly, $I_{mag}$ and $V_{mag}$ are also reduced to zero and magnetization losses are essentially eliminated. Other values of R5, R6 & R4 may in some cases be advantageous while providing an equal but opposite impedance to the current transformer.

Illustrated in FIG. 5 also are the various measurements of interest for purposes of determining the accuracy of the transformer: $V_{mag}$ (110) is the magnetizing voltage drop across the secondary winding; $I_{mag}$ (109) is the magnetizing current flowing through the L1-R1 inductor-resistor (107, 108) leg of the parallel circuit; $V_{out}$ (112) is the output voltage and $I_{out}$ (114) through R4 (115) is the output current flowing through the impedance compensation circuit.

As before, using fundamental calculations well known to those reasonably skilled in the relevant art, it is easily shown that a theoretical current transformer having these parameters and ignoring parasitic effects for the secondary winding should have an output current ($I_{out}$) of 100 mA(rms) and an output voltage ($V_{out}$) of 4,000 mV (rms). These values are used as baselines to illustrate the accuracy of a current transformer of this novel design under operating conditions at various levels of $L_{mag}$.

Figure 6:
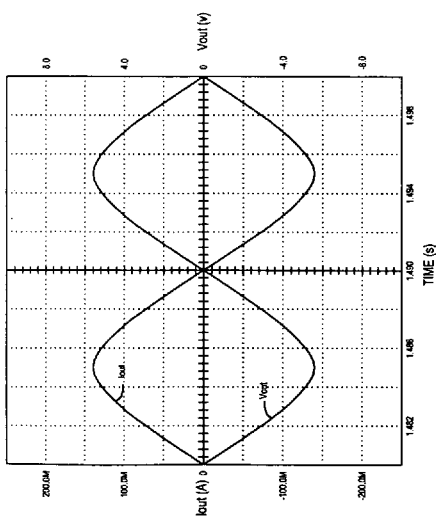
FIG. 6 illustrates the output voltage ($V_{out}$) and current ($I_{out}$) present at the burden resistor R4 of the circuit in FIG. 5 with a secondary winding magnetic inductance ($L_{mag}$) value of 50 mH.
Figure 7:
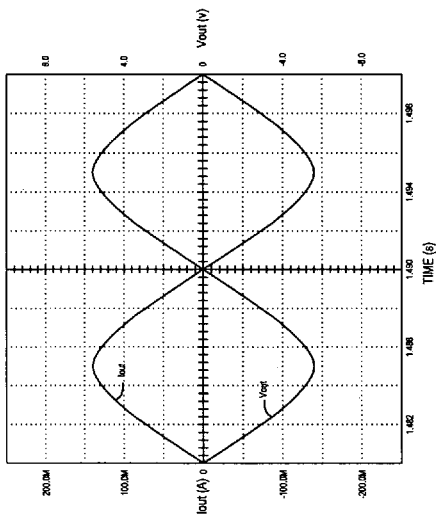
FIG. 7 illustrates the output voltage ($V_{out}$) and current ($I_{out}$) present at the burden resistor R4 of the circuit in FIG. 5 with a secondary winding magnetic inductance ($L_{mag}$) value of 500 mH.
Figure 8:
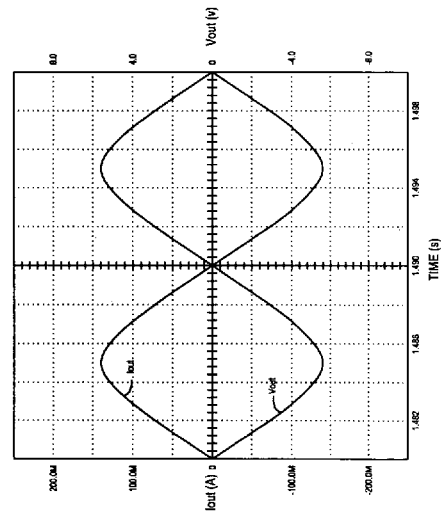
FIG. 8 illustrates the output voltage ($V_{out}$) and current ($I_{out}$) present at the burden resistor R4 of the circuit in FIG. 5 with a secondary winding magnetic inductance ($L_{mag}$) value of 5,000 mH.

Referring now to FIGS. 6-8, illustrated are graphs of the output of the transformer of FIG. 5 at $L_{mag}$ levels of 50, 500, and 5,000 mH respectively. Table 3 summarizes the resulting values of $I_{out}$ and $V_{out}$ and the error (expressed as a percentage) for each. Table 4 illustrates the corresponding values of $I_{mag}$ and $V_{mag}$ at the tested levels of $L_{mag}$.

TABLE 3

| | Expected Values | | Actual Values | | |
|---|---|---|---|---|---|
| $L_{mag}$ mH | $I_{out}$ mA(rms) | $V_{out}$ mV(rms) | $I_{out}$ mA(rms) | $V_{out}$ mV(rms) | % Error |
| 50 (FIG. 6) | 100 | 4,000 | 99.9 | 4,000 | 0.1% |
| 500 (FIG. 7) | 100 | 4,000 | 100.0 | 4,000 | 0% |
| 5,000 (FIG. 8) | 100 | 4,000 | 100.0 | 4,000 | 0% |

TABLE 4

| $L_{mag}$ mH | $I_{mag}$ mA(rms) | $V_{mag}$ mV(rms) |
|---|---|---|
| 50 (FIG. 6) | 0.0595 | 3.46 |
| 500 (FIG. 7) | 0.0182 | 3.70 |
| 5,000 (FIG. 8) | 0.0153 | 3.62 |

As Table 3 illustrates, near-zero error is achieved in the values of $I_{out}$ and $V_{out}$ even with relatively low values of $L_{mag}$. An error of 0.01% is achieved when $L_{mag}$ is 50 mH, a tremendous improvement over the 46.7% error achieved in an uncompensated current transformer having the same level of $L_{mag}$. As Table 4 demonstrates, the values for $I_{mag}$ and $V_{mag}$ remain close to zero regardless of the level of $L_{mag}$.

Figure 9:
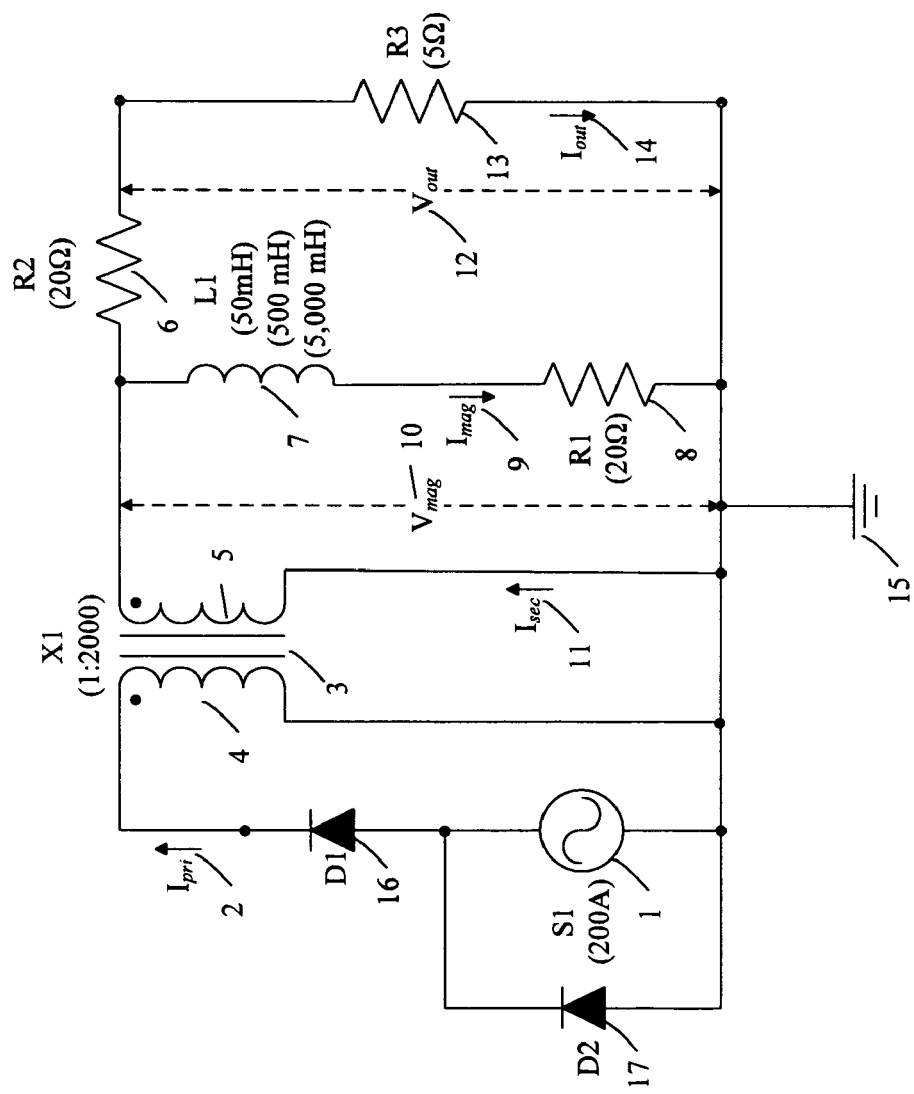
FIG. 9 illustrates a schematic representation of a typical current transformer according to the prior art driven by a rectified AC source having a power profile of 200 A (rms), 282.8 A (peak), 50 Hz halfwave.

Referring next to FIG. 9, illustrated is a schematic representation of the current transformer according FIG. 1 in which the primary current $I_{pri}$ (2) has been rectified so that only the positive half of the AC cycle is driven through the primary winding (4). The only difference between the transformer shown in FIG. 9 and that shown in FIG. 1 being the inclusion of rectifying diodes D1 (16) and D2 (17). The current transformer of FIG. 9 is intended to illustrate the accuracy, or lack thereof, of a current transformer of the prior art when there are significant DC elements in the primary current.

The current transformer of FIG. 9 uses a primary current $I_{pri}$ of 200 A(rms), 282.8 A(peak), which through rectification is reduced to 141.4 A(rms). Ideal $I_{out}$ for this transformer is 70.7 ma(rms) and ideal $V_{out}$ is 353.5 mV(rms). These ideal values are, again used as baselines to illustrate the accuracy of a current transformer of the prior art design under operating conditions at various levels of $L_{mag}$ when being driven by a current with substantial DC elements.

Referring now to FIGS. 10-12, illustrated are graphs of the output of the transformer of FIG. 9 at $L_{mag}$ levels of 50, 500, and 5,000 mH respectively. Table 5 summarizes the resulting values of $I_{out}$ and $V_{out}$ and the error (expressed as a percentage) for each.

TABLE 5

| $L_{mag}$ mH | Expected Values | | Actual Values | | |
| --- | --- | --- | --- | --- | --- |
| | $I_{out}$ mA(rms) | $V_{out}$ mV(rms) | $I_{out}$ mA(rms) | $V_{out}$ mV(rms) | % Error |
| 50 (FIG. 10) | 70.7 | 353.5 | 36.6 | 183 | 48.2% |
| 500 (FIG. 11) | 70.7 | 353.5 | 56.7 | 283 | 19.8% |
| 5,000 (FIG. 12) | 70.7 | 353.5 | 58.1 | 290 | 17.8% |

As Table 5 illustrates, as $L_{mag}$ is increased, the values of $I_{out}$ and $V_{out}$ approach the expected values but significant error is still present even at a relatively high $L_{mag}$ level of 5,000 mH. Importantly, a ten-fold increase in $L_{mag}$ only yielded a modest 2% increase in accuracy. This illustrates that near-zero error is not likely to ever be achieved for a current transformer of this type when driven by power sources with significant DC elements present.

Figure 13:
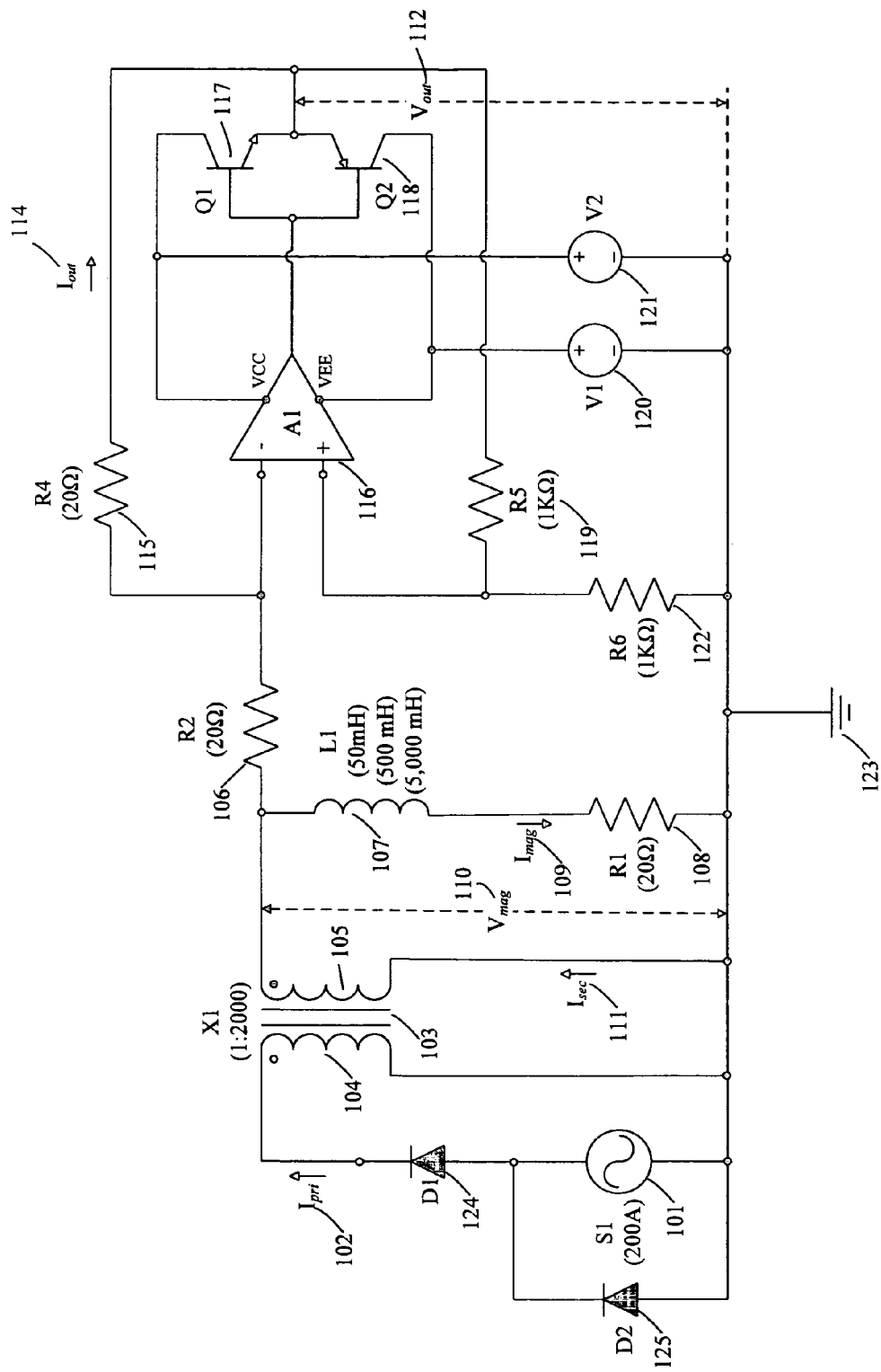
FIG. 13 illustrates a schematic representation of a current transformer according to an embodiment of the present invention driven by a rectified AC source having a power profile of 200 A (rms), 282.8 A (peak), 50 Hz halfwave.

Referring now for comparison to FIG. 13, illustrated is a schematic representation of the current transformer according FIG. 5 in which the primary current $I_{pri}$ (102) has been rectified so that only the positive half of the AC cycle is driven through the primary winding (104). The only difference between the transformer shown in FIG. 9 and that shown in FIG. 1 being the inclusion of rectifying diodes D1 (124) and D2 (125). The current transformer of FIG. 13 is intended to illustrate the accuracy of a current transformer according to the present invention when there are significant DC elements in the primary current.

The current transformer of FIG. 13 uses a primary current $I_{pri}$ of 200 A(rms), 282.8 A(peak), which through rectification is reduced to 141.4 A(rms). Ideal $I_{out}$ for this transformer is 70.7 mA(rms) and ideal $V_{out}$ is 2,828 mV(rms). These ideal values are, again used as baselines to illustrate the accuracy of a current transformer of the prior art design under operating conditions at various levels of $L_{mag}$ when being driven by a current with substantial DC elements.

Referring now to FIGS. 14-16, illustrated are graphs of the output of the transformer of FIG. 13 at $L_{mag}$ levels of 50, 500, and 5,000 mH respectively. Table 6 summarizes the resulting values of $I_{out}$ and $V_{out}$ and the error (expressed as a percentage) for each. Table 7 illustrates the corresponding values of $I_{mag}$ and $V_{mag}$ at the tested levels of $L_{mag}$.

TABLE 6

| $L_{mag}$ mH | Expected Values | | Actual Values | | |
| --- | --- | --- | --- | --- | --- |
| | $I_{out}$ mA(rms) | $V_{out}$ mV(rms) | $I_{out}$ mA(rms) | $V_{out}$ mV(rms) | % Error |
| 50 (FIG. 14) | 70.7 | 2,830 | 70.7 | 2,830 | 0% |
| 500 (FIG. 15) | 70.7 | 2,830 | 70.7 | 2,830 | 0% |
| 5,000 (FIG. 16) | 70.7 | 2,830 | 70.7 | 2,830 | 0% |

TABLE 7

| $L_{mag}$ mH | $I_{mag}$ mA(rms) | $V_{mag}$ mA(rms) |
| --- | --- | --- |
| 50 (FIG. 14) | 0.0333 | 1.14 |
| 500 (FIG. 15) | 0.0163 | 2.69 |
| 5,000 (FIG. 16) | 0.0153 | 2.56 |

As with the pure AC-powered examples, Tables 6 and 7 illustrate that the current transformer according to the present design exhibits near-zero error at virtually all levels of $L_{mag}$ even when driven by current with significant DC elements. Lower values of R1 will cause an increase in error due to the DC component.

Many variations on the above improvements and inventions will be apparent to those skilled in the art. For example, a further enhancement to the presently disclosed compensated current transformer would be to add means for allowing the compensating virtual impedance to track, and neutralize, changes in the secondary winding resistance caused by fluctuations in temperature.

Figure 17:
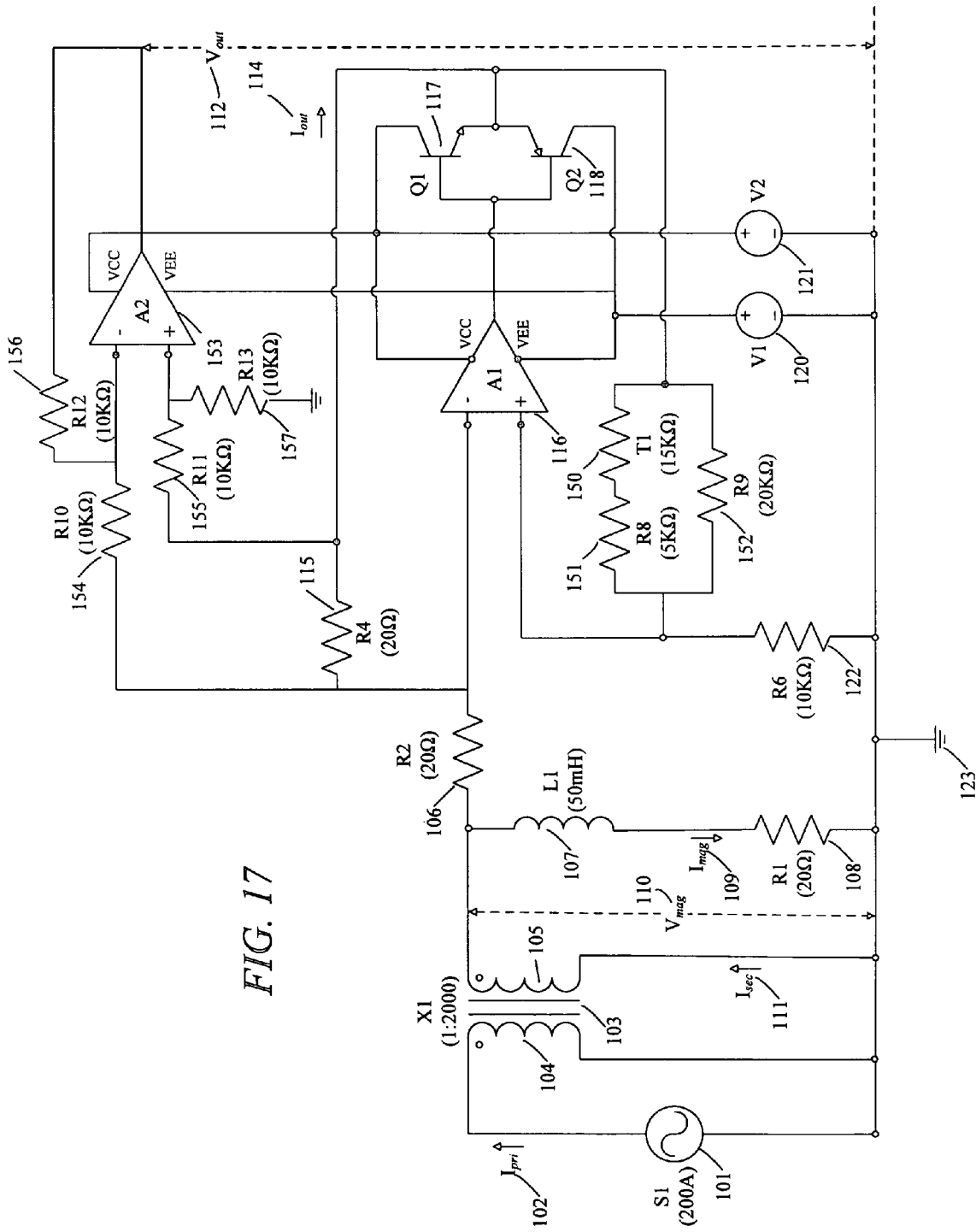
FIG. 17 illustrates a schematic representation of a current transformer according to an embodiment of the present invention that includes temperature-compensation circuitry.

FIG. 17 illustrates a schematic representation of a novel current transformer according to the present invention incorporating temperature compensation circuitry. The current transformer shown in FIG. 17 is identical in all respects to that of the current transformer of FIG. 5 with the exception that resistor R5 (119) has been replaced by a temperature compensating circuit comprised of a thermistor T1 (150) and two resistors R8 (151) and R9 (152) connected in parallel with each other. Also different in the current transformer shown in FIG. 17 is a differential amplifier network comprising operational amplifier A2 (153) and resistors R10 (154), R11 (155), R12 (156) and R13 (157) which is connected in parallel with existing operational amplifier A1 (116).

In this circuit, thermistor T1 (150) has a negative temperature coefficient and is assumed to be exposed to the same, or nearly the same, temperature as the secondary winding (105.) As temperature increases and winding resistance R2 (106) increase (typically at a rate of 0.4% per degree centigrade), the resistance of T1 decreases causing the total resistance of the temperature compensating network (comprised of a thermistor T1 (150) and two resistors R8 (151) and R9 (152)) to also decrease and the virtual impedance to increase. With an appropriate choice or characteristics for T1 (150), R8 (151) and R9 (152), virtual impedance can very closely, if not exactly, track the negative value of winding resistance R2 (106). This will, in effect, neutralize the fluctuations in winding resistance R2 (106) through changes in temperature and will also ensure that $I_{mag}$ remains close to zero. In this fashion, temperature compensation of the winding resistance can be achieved allowing the benefits of the compensated current transformer herein disclosed to be enjoyed over a wide range of temperatures.

Accordingly, it will be understood that the preferred embodiment of the present invention has been disclosed by way of example and that other modifications and alterations may occur to those skilled in the art without departing from the scope and spirit of the appended claims.

I claim:

1. An impedance-compensated current transformer comprising:
   a primary winding;
   a power source electrically coupled through said primary winding;
   a secondary winding magnetically coupled to said primary winding, said secondary winding having a secondary winding magnetizing inductance and a secondary winding resistance;
   an impedance-compensation circuit electrically coupled across said secondary winding;
   wherein said impedance-compensation circuit actively reflects to said secondary winding a virtual impedance which is equal in magnitude and opposite in polarity to said secondary winding resistance such that the current-driving voltage across said secondary winding magnetizing inductance is driven to zero independently of the value of said secondary winding magnetizing inductance;

wherein said impedance-compensation circuit includes means to vary said virtual impedance of said impedance-compensation circuit in direct proportion to variations in the temperature of said secondary winding; and wherein said impedance-compensation circuit comprises an operational amplifier having a positive input, a negative input, an output, a positive supply and a negative supply; a first resistor having a resistance approximately equal to said secondary winding resistance; a thermistor with a negative temperature coefficient having an average resistance which is much greater than the resistance of said first resistor; and a second resistor having a resistance which is much greater than the resistance of said first resistor; wherein said first resistor is electrically coupled across said operational amplifier negative input and said operational amplifier output; said thermistor is electrically coupled across said operational amplifier positive input and said operational amplifier output and is exposed to approximately the same temperature as said secondary winding; and said second resistor is electrically coupled across said operational amplifier positive input and ground.

2. The current transformer of claim 1 wherein said thermistor is replaced by a temperature compensating circuit comprised of a thermistor and a third resistor connected in series and a fourth resistor connected in parallel to said thermistor and third resistor.

3. The current transformer of claim 2 wherein said impedance-compensation circuit further comprises:

a current boosting circuit electrically coupled in series between said operational amplifier output and said first and second resistors, said current boosting circuit comprising an NPN transistor and a PNP transistor each having a base, a collector and an emitter;

wherein said bases of said NPN and said PNP transistors are electrically coupled to said operational amplifier output;

said emitters of said NPN and said PNP transistors are electrically coupled to said first and second resistors;

said collector of said NPN transistor is electrically coupled to said operational amplifier positive supply; and said collector of said PNP transistor is electrically coupled to said operational amplifier negative supply.

4. The current transformer of claim 3 wherein said power source is an alternating current power source.

5. The current transformer of claim 3 wherein said power source is a rectified alternating current power source such that only the positive half of the alternating current is driven through said primary winding.

6. The current transformer of claim 3 wherein said power source is a combination of an alternating current power source and a rectified alternating current power source.

7. The current transformer of claim 1 wherein said power source is an alternating current power source.

8. The current transformer of claim 1 wherein said power source is a rectified alternating current power source such that only the positive half of the alternating current is driven through said primary winding.

9. The current transformer of claim 1 wherein said power source is a combination of an alternating current power source and a rectified alternating current power source.

* * * * *